United States Patent [19]

Tachikawa et al.

[11] 4,341,572
[45] Jul. 27, 1982

[54] METHOD FOR PRODUCING $Nb_3Sn$ SUPERCONDUCTORS

[75] Inventors: Kyoji Tachikawa, Tokyo; Kazumasa Togano; Takao Takeuchi, both of Sakura, all of Japan

[73] Assignee: National Research Institute for Metals, Tokyo, Japan

[21] Appl. No.: 205,243

[22] Filed: Nov. 10, 1980

[30] Foreign Application Priority Data

Nov. 12, 1979 [JP] Japan .................... 54/145459

[51] Int. Cl.$^3$ ............... H01L 39/00; C22C 27/02
[52] U.S. Cl. ........................... 148/11.5 F; 148/133
[58] Field of Search ............ 148/11.5 R, 11.5 F, 148/11.5 Q, 127, 133; 29/599; 427/62

[56] References Cited

U.S. PATENT DOCUMENTS 3,954,572  5/1976  Ziegler et al. .............. 29/599 X
4,084,989  4/1978  Meyer ..................... 148/11.5 Q X
4,224,087  9/1980  Tachikawa et al. ........ 148/11.5 Q X

FOREIGN PATENT DOCUMENTS 52-127195  10/1977  Japan .................... 148/11.5 Q
55-107769   8/1980  Japan .................... 427/62

Primary Examiner—Peter K. Skiff
Attorney, Agent, or Firm—Fitzpatrick, Cella, Harper & Scinto

[57] ABSTRACT

In a method for producing a $Nb_3Sn$ superconductor which comprises drawing a composite having a core of a Nb-Hf alloy containing 0.1 to 30 atomic % of Hf and a sheath containing Cu and Sn, and heat-treating the composite to form a $Nb_3Sn$ layer between the core and the sheath; the improvement wherein the sheath is formed of pure Cu, a Cu-Sn alloy containing not more than 6 atomic % of Sn, a Cu-Ga alloy containing not more than 20 atomic % of Ga, a Cu-Al alloy containing not more than 20 atomic % of Al, a Cu-Ga-Sn alloy containing not more than 6 atomic % of Sn and not more than 20 atomic % of Ga, or a Cu-Al-Sn alloy containing not more than 6 atomic % of Sn and not more than 20 atomic % of Al; and after the drawing, a Sn film is coated on the surface of the sheath, and then the product having a Sn film coated thereon is heat-treated.

2 Claims, No Drawings

METHOD FOR PRODUCING NB₃SN SUPERCONDUCTORS

This invention relates to an improvement relating to a method for producing a Nb₃Sn superconductor, particularly, a Nb₃Sn superconductor suitable for generating a strong magnetic field.

Nb-Ti type alloy wires have been used heretofore as superconducting wires for the generation of a strong magnetic field. The magnetic field generated by these conventional wires, however, is 85,000 gauss [corresponding to 8.5 tesla (T for short)] at the highest, and compound superconductors must be used to generate a strong magnetic field of 12 T or more which is required, for example, in a nuclear fusion reactor.

Nb₃Sn compound is known as a superconducting material which meets this need, and a method for fabricating it into wire form is also known. For example, A. R. Kaufmann et al., in Bull. Am. Phys. Soc., 15, 838 (1970), proposed a method for producing wires of Nb₃Sn compound which comprises plastically fabricating a composite composed of a core of Nb and a sheath of Cu-Sn alloy, and heat-treating the composite (the method which we call the "composite process").

In recent years, however, superconducting wires for large-scale magnets used in nuclear fusion, high energy physics, energy storage, etc. have been required to have a higher critical current in a strong magnetic field range of more than 15 T. The above conventional method for producing Nb₃Sn cannot meet this requirement. To obtain a magnet capable of generating a high magnetic field, it is necessary to use superconducting wires having both a high upper critical magnetic field $H_{c2}$ and a high critical current density $J_c$ ($J_c$ is a value resulting from division of the critical current $I_c$ measured in a magnetic field by the cross-sectional area of the superconductor). The $J_c$ of Nb₃Sn wires produced by the above conventional method rapidly decreases in a magnetic field of 12 T or more, and it is difficult to produce superconducting magnets capable of generating a magnetic field of 12 T or more from these wires.

The present inventors previously developed a method which comprises drawing a composite composed of a core of a binary alloy of a solid solution of Hf in Nb and a sheath of a Cu-Sn alloy or a ternary alloy of a solid solution of Ga or Al in the Cu-Sn alloy, and heat-treating the drawn product See U.S. Pat. No. 4,224,087. According to the method of said patent, Hf in the Nb alloy serves to enhance the growth rate of Nb₃Sn and increase the thickness of the Nb₃Sn layer and thus increase the critical current $I_c$. Furthermore, Hf dissolves in the Nb₃Sn phase to increase $H_{c2}$. Ga or Al added to the Cu-Sn alloy also diffuses in the Nb alloy together with Sn and dissolves in the Nb₃Sn phase to increase its $H_{c2}$. In this way, the method of said patent can afford a composite having improved strong magnetic field properties. In this prior method, a Cu-Sn binary alloy or a ternary Cu-base alloy is used as the sheath portion of the composite, i.e. as a maxtrix of the superconducting wire. In order to obtain excellent superconducting properties, the concentration of Sn, etc. in the Cu-base alloy should desirably be as high as possible. On the other hand, in order to ensure sufficient fabricability, the concentration of Sn, Sn+Ga or Sn+Al should be limited within a range of their solid solubility in Cu. Accordingly, the amount of Sn used is restricted, and particularly, in the ternary alloy containing Ga or Al, the amount of Sn must be decreased corresponding to the amount of Ga or Al added. Consequently, the prior technique has the disadvantage that the amount of Sn is insufficient to obtain excellent superconducting properties.

It is an object of this invention therefore to remedy the aforesaid defects of the prior techniques, and to provide a method for producing a Nb₃Sn superconductor having excellent strong magnetic field properties from a composite having good fabricability and containing a sufficient amount of Sn.

The present inventors have made extensive investigations in order to achieve the above object, and found that a Nb₃Sn layer containing small amounts of Hf and Ga or Al and having improved strong magnetic field properties can be easily formed at the interface of a composite by producing a composite composed of a core of a Nb-Hf alloy (consisting of Nb and 0.1 to 30 atomic % of Hf) and a sheath having good fabricability and consisting of pure copper or a Cu-Sn alloy having a low content of Sn (containing not more than 6 atomic % of tin) instead of the sheath of the Cu-Sn binary alloy or the Cu-Sn-Ga or Cu-Sn-Al ternary alloy used in the method of the aforesaid U.S. Pat. No. 4,224,087, then drawing the composite into a desired shape, coating pure Sn or a Sn-Ga or Sn-Al alloy (containing not more than 50 atomic % of Ga or Al) on the surface of the sheath portion of the fabricated product by plating, etc., and then heat-treating the resulting product. It has also been found that a similar improvement can be achieved by drawing a composite containing as a sheath a Cu-base Ga or Al alloy having a low alloy concentration (containing up to 20 atomic %, preferably 5 to 10 atomic %, of Ga or Al) or an alloy resulting from including a small amount of Sn therein, coating Sn on the surface of the sheath portion of the fabricated product in the same manner as above, and heat-treating the resulting product.

According to the present invention, there is provided, in a method for producing a Nb₃Sn superconductor which comprises drawing a composite having a core of a Nb-Hf alloy containing 0.1 to 30 atomic % of Hf and a sheath containing Cu and Sn and heat-treating the composite to form a Nb₃Sn layer between the core and the sheath, the improvement wherein the sheath is formed of pure Cu, a Cu-Sn alloy containing not more than 6 atomic % of Sn, a Cu-Ga alloy containing not more than 20 atomic % of Ga, a Cu-Al alloy containing not more than 20 atomic % of Al, a Cu-Ga-Sn alloy containing not more than 6 atomic % of Sn and not more than 20 atomic % of Ga, or a Cu-Al-Sn alloy containing not more than 6 atomic % of Sn and not more than 20 atomic % of Al; and after the drawing, a Sn film is coated on the surface of the sheath, said Sn film optionally containing up to 50 atomic % of Ga or Al when the sheath of the composite is formed of pure Cu or the Cu-Sn alloy, and then the product having Sn coated thereon is heat-treated.

The amount of Hf in the Nb-Hf alloy forming the core of the composite in the present invention should be at least 0.1 atomic % in order to obtain excellent superconducting properties. Its upper limit should be 30 atomic % in order to secure good fabricability of the Nb-Hf alloy. The preferred amount of Hf is in the range of 2 to 10 atomic %.

Copper forming the sheath of the composite may contain a small amount of Sn. In order to secure good fabricability at ordinary temperature, the amount of Sn should not exceed 6 atomic %. It is usually 0.1 to 6 atomic %, preferably 3 to 5 atomic %.

When the sheath of the composite is formed of a Cu-base alloy containing Ga or Al, the amount of Ga or Al to be included in the Cu-base alloy should be at least 0.1 atomic % in order to obtain excellent superconducting properties. On the other hand, in order to obtain good fabricability of the Cu-base alloy, the amount of Ga or Al should be up to 20 atomic %, preferably 5 to 10 atomic %. A small amount of Sn may be included in the Cu-Ga alloy or Cu-Al alloy. The amount of Sn in this case should be up to 6 atomic % in order to keep the alloy readily fabricable at ordinary temperature.

When amount of Ga or Al addition in the Cu-Ga alloy or Cu-Al alloy exceeds 10 atomic %, the amount of Sn is preferably up to 3 atomic %.

A composite is produced from the aforesaid metals or alloys, and fabricated into a wire, tape tube, etc. by wire drawing, rolling, tube drawing, etc. Then, pure Sn or Sn alloy is coated on the outside surface of the sheath portion of the fabricated product. The method for coating of Sn may be any desired method such as electroplating, hot-dip plating or vacuum deposition. In the case of hot-dip plating, Cu may be added to a molten plating bath. Cu included in the plated film serves to promote the diffusive formation of $Nb_3Sn$ during the heat-treatment. In order to obtain a sufficient effect, the amount of Cu is preferably at least 0.1 atomic %. To obtain a plated film of good quality, the amount of Cu is preferably not more than 50 atomic %.

When the plated film is a Sn alloy containing Ga or Al, the amount of Ga or Al in the Sn alloy is preferably at least 0.1 atomic % in order to obtain excellent superconducting properties. It should be not more than 50 atomic % in order to form a $Nb_3Sn$ layer having sufficient thickness.

The amount of Sn or the Sn alloy to be coated is not critical, but is usually 0.1 to 50 atomic %, preferably 5 to 20 atomic %, based on the sheath.

The heat-treatment is carried out at a temperature of usually 500° to 1,000° C., preferably 600° to 800° C., for a period of 1 minute to 200 hours, preferably 1 hour to 100 hours. If the heat-treating temperature is lower than the specified lower limit, a sufficient amount of the $Nb_3Sn$ layer is not formed. If the heat-treating temperature is higher than the specified upper limit, crystal grains of $Nb_3Sn$ become coarse to degrade the superconducting properties of the final product.

Since according to the method of this invention, pure Cu or a Cu alloy containing a small amount of an alloy component such as Sn, Ga or Al, which has good fabricability, is used as the sheath, the fabrication of the resulting composite into wires, tapes, tubes, etc. is much easier than that of composites of conventional compound superconductor materials, and intermediate annealings can be omitted. Hence, the cost of fabrication can be reduced. Consequently, it is possible to produce very easily multifilamentary wires which are stable to rapid variations in magnetic field.

Furthermore, because an additive element such as Sn, Ga or Al for the formation of $Nb_3Sn$ is diffused from the outside of the fabricated composite, sufficient amounts of Sn and Ga or Al can be supplied, and the superconducting properties of the composite can be markedly improved.

In a conventional composite processing method, the ratio of the cross-sectional area of a Cu-Sn sheath alloy to that of a Nb core should be large because the absolute amount of Sn to be used is large. In contrast, since Sn is supplied from outside in the present invention, it is possible to decrease the cross-sectional area of the sheath as compared with the conventional method and to improve markedly the $J_c$ value with respect to the total cross sectional area of the wire.

As the $Nb_3Sn$ superconductor obtained by the method of this invention has a high $H_{c2}$ and a high $J_c$ in a strong magnetic field, it can be used as a wire which makes possible the production of a superconducting magnet capable of generating a magnetic field of 15 T or more. Furthermore, since it can be made into an multifilamentary wire, the superconductor obtained by the method of this invention is advantageous in regard to stability to a flux jump or to variations of a magnetic field with time.

Accordingly, the use of the $Nb_3Sn$ superconductor obtained by the method of this invention can lead to the generation of a strong magnetic field with high stability, and the superconductor in accordance with this invention is useful as various strong field magnetic materials for nuclear fusion reactors, high energy physics, energy storage, magnetically levitated trains, magnetic separation and solid state physics research.

The following Examples illustrate the present invention more specifically.

EXAMPLE 1

Pure Nb and a mixture of Nb and 2 atomic % of Hf were melted in an argon atmosphere in an arc melting furnace, and fabricated to a diameter of 3.5 mm by using a grooved roll and by swaging to produce a pure Nb rod and a Nb-Hf alloy rod as a core material.

Each of the core materials was inserted into a pure Cu tube having an outside diameter of 9 mm and an inside diameter of 3.5 mm, and the composite was fabricated into a thin wire having a diameter of 0.80 mm by using a grooved roll and by drawing without intermediate annealing. Also, a Nb-3 atomic % Hf alloy was inserted into a Cu-4 atomic % Sn alloy tube of the same size as the above copper tube, and the resulting composite was fabricated in the same way as above into a wire having a diameter of 0.80 mm.

Then, each of these wires was continuously dipped in a molten bath of pure Sn, an alloy of Sn containing 30 atomic % of Ga, or an alloy of Sn containing 30 atomic % of Al to deposit thereon a film of Sn, the Sn-Ga alloy or the Sn-Al alloy having a thickness of about 30 μm. The product was sealed into a quartz tube in an argon gas, and heat-treated at 800° C. for 20 hours.

The results obtained are shown in Table 1.

TABLE 1

|  | Core | Sheath | Plating Material | Thickness of $Nb_3Sn$ (μm) | $J_c$ ($10^4$ A/cm$^2$ 4.2K, 15T) | $T_c$ (K) |
| --- | --- | --- | --- | --- | --- | --- |
| Invention | Nb-3% Hf | Pure Cu | Pure Sn | 25 | 8 | 18.0 |
|  | " | " | Sn + 30% Ga | 16 | 13 | 18.3 |
|  | " | " | Sn + 30% Al | 18 | 11 | 18.2 |
|  | " | Cu-4Sn | Sn + 30% Ga | 22 | 14 | 18.3 |

TABLE 1-continued

| | Core | Sheath | Plating Material | Thickness of $Nb_3Sn$ (μm) | $J_c$ ($10^4$ A/cm² 4.2K, 15T) | $T_c$ (K) |
|---|---|---|---|---|---|---|
| Comparison | Nb | Pure Cu | Pure Sn | 11 | 3 | 17.5 |
| | " | " | Sn + 30% Ga | 7 | 6 | 18.0 |

The following conclusions can be drawn from the results obtained.

A sample obtained by using the Nb-3% Hf alloy as a core contained a $Nb_3Sn$ layer having a much larger thickness than that in a sample obtained by using pure Nb as a core. Furthermore, since $H_{c2}$ increases with increasing Tc, the critical current density $J_c$ in a strong field of more than 15 T can be markedly improved. Furthermore, since the superconducting current actually flowing through the wire is proportional to the product of $J_c$ and the thickness of the $Nb_3Sn$ layer, the superconducting current capacity increases markedly.

Samples obtained by using Sn+30% Ga and Sn+30% Al have a higher $T_c$ and a higher $J_c$ in a strong magnetic field by the effect of a small amount of Ga or Al diffused into the $Nb_3Sn$ layer in addition to having the aforesaid advantage attributed to Hf. However, because the addition of Ga or Al retards the growth rate of $Nb_3Sn$ and decreases the thickness of the $Nb_3Sn$ layer, when Ga or Al is to be added, it is most effective in practice to use a Nb-Hf alloy core as in the present Example.

When the Cu-4 atomic % Sn sheath is used, the thickness of the $Nb_3Sn$ layer can be increased without substantially impairing the fabricability of the composite as compared with the case of using pure Cu as a sheath.

EXAMPLE 2

A mixture of Nb and 6 atomic % of Hf was melted in an electron beam melting furnace, and processed into a Nb-Hf alloy rod having a diameter of 3.5 mm by using a grooved roll and by swaging. The Nb-Hf alloy rod was inserted into a Cu-base alloy tube having an outside diameter of 9 mm and an inside diameter of 3.5 mm. The composition of the tube was Cu-7 atomic % Ga or Cu-7 atomic % Al. The composite was fabricated into a fine wire having a diameter of 0.80 mm by using a grooved roll and by drawing. Then, Sn was electroplated on the surface of the fine wire to a thickness of about 30 μm, and the product was heat-treated in an argon atmosphere at 800° C. for 20 hours.

Separately, a fine wire was produced in the same way as above except that a Cu-7 atomic % Ga alloy was used as the sheath, and an alloy of Sn containing 20 atomic % of Cu was electroplated on the fine wire, followed by heat-treatment.

The results are shown in Table 2.

TABLE 2

| | Core | Sheath | Plating material | Thickness of the $Nb_3Sn$ layer (μm) | $J_c$ ($10^4$ A/cm² 4.2K, 15T) | $T_c$ (K) |
|---|---|---|---|---|---|---|
| Invention | Nb-6% Hf | Cu-7% Ga | Pure Sn | 20 | 15 | 18.5 |
| | " | Cu-7% Al | " | 22 | 12 | 18.2 |
| | " | Cu-7% Ga | Sn + 20% Cu | 25 | 15 | 18.4 |
| Comparison | " | Cu-4.5% Sn-7% Ga | — | 12 | 7 | 17.6 |

The measured values shown in Table 2 demonstrate a marked improvement over conventional composite wires. For example, a superconducting wire produced by an ordinary composite process from a core of a Nb-6% Hf alloy and a sheath of a Cu-4.5% Sn-7% Ga alloy is one of composite fabricated $Nb_3Sn$ superconducting wires having the best properties. The properties of this wire are shown in Table 2 as a comparison. It is seen that $J_c$ and $T_c$ obtained by in this Example are higher than those of the aforesaid comparative wire.

Furthermore, since the superconducting current actually flowing in the wire is proportional to the product of the thickness of the $Nb_3Sn$ layer and $J_c$, the superconducting current capacity in a strong magnetic field increases markedly.

Furthermore, the Cu-4.5% Sn-7% Ga alloy used as the sheath of the comparative wire shows rapid work hardening during the fabrication. When fabricated to 50 % reduction in area after annealing, it has a Vickers hardness of as high as 250, and further fabrication becomes impossible. In contrast, the Cu-7 atomic % Ga and the Cu-7 atomic % Al used as the sheath in this Example hardens little upon fabrication, and can be processed to at least 95% after annealing, and the fabricating process can be much simplified.

EXAMPLE 3

A superconducting wire was produced in the same way as in Example 2 except that the compositions of the sheath material and the core material were changed as shown in Table 3. The results are also shown in Table 3.

TABLE 3

| Core | Sheath | Plating material | Thickness of the $Nb_3Sn$ layer (μm) | $J_c$ ($10^4$ A/cm² 4.2K, 15T) | $T_c$ (K) |
|---|---|---|---|---|---|
| Nb-6% Hf | Cu-2% Sn-7% Ga | Pure Sn | 24 | 16 | 18.5 |
| Nb-6% Hf | Cu-2% Sn-7% Al | " | 25 | 13 | 18.2 |
| Nb-3% Hf | Cu-4% Sn | Sn + 20% Ga + 10% Cu | 23 | 14 | 18.2 |
| Nb-3% Hf | " | Sn + 20% Al + 10% Cu | 23 | 12 | 18.1 |

What we claim is:

1. In a method for producing a $Nb_3Sn$ superconductor which comprises drawing a composite having a core of a Nb-Hf alloy containing 0.1 to 30 atomic % of Hf and a sheath containing Cu and Sn, and heat-treating the composite to form a $Nb_3Sn$ layer between the core and the sheath; the improvement wherein the sheath is formed of a Cu-Ga alloy containing not more than 20 atomic % of Ga, a Cu-Al alloy containing not more than 20 atomic % of Al, a Cu-Ga-Sn alloy containing not more than 6 atomic % of Sn and not more than 20 atomic % of Ga or a Cu-Al-Sn alloy containing not more than 6 atomic % of Sn and not more than 20 atomic % of Al; and after the drawing, coating a Sn film onto the surface of the sheath, and then heat-treating the resulting product.

2. The method of claim 1 wherein said Sn film contains up to 50 atomic % of Cu.

* * * * *